(12) United States Patent
Amey et al.

(10) Patent No.: US 8,707,551 B2
(45) Date of Patent: Apr. 29, 2014

(54) BENDABLE CIRCUIT BOARD FOR LED MOUNTING AND INTERCONNECTION

(71) Applicant: E.I. du Pont de Nemours and Company, Wilmington, DE (US)

(72) Inventors: Daniel I. Amey, Durham, NC (US); Deborah R. Gravely, Martinsville, VA (US); Michael J. Green, Cary, NC (US); Steven H. White, Chapel Hill, NC (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 13/965,778

(22) Filed: Aug. 13, 2013

(65) Prior Publication Data

US 2013/0330533 A1    Dec. 12, 2013

Related U.S. Application Data

(63) Continuation of application No. 13/269,148, filed on Oct. 7, 2011, now abandoned, which is a continuation of application No. 12/744,685, filed as application No. PCT/US2008/085292 on Dec. 3, 2008, now abandoned.

(60) Provisional application No. 61/005,222, filed on Dec. 4, 2007.

(51) Int. Cl.
*H05K 3/00* (2006.01)

(52) U.S. Cl.
USPC ............... 29/829; 29/825; 29/592.1; 29/830; 29/840; 29/842; 428/220; 428/98; 174/254; 174/250

(58) Field of Classification Search
USPC ........ 29/829, 825, 592.1, 830, 832, 840, 842; 428/220, 98; 174/254, 250, 68.1
See application file for complete search history.

(56) References Cited

U.S. PATENT DOCUMENTS

| | | | |
|---|---|---|---|
| 4,615,950 | A | 10/1986 | Hung et al. |
| 4,939,316 | A | 7/1990 | Mahulikar et al. |
| 5,068,708 | A | 11/1991 | Newman |
| 5,769,533 | A | 6/1998 | Yamuro et al. |
| 5,920,643 | A | 7/1999 | White et al. |
| 6,183,104 | B1 | 2/2001 | Ferrara |
| 6,290,713 | B1 | 9/2001 | Russell |
| 6,502,968 | B1 | 1/2003 | Simon |
| 7,086,756 | B2 | 8/2006 | Maxik |
| 7,100,814 | B2 | 9/2006 | Blood |

(Continued)

FOREIGN PATENT DOCUMENTS

| | | |
|---|---|---|
| JP | 2005-056729 | 3/2005 |
| JP | 2007-107036 A | 4/2007 |
| JP | 2007107036 A * | 4/2007 |

OTHER PUBLICATIONS

G. Brines et al., "Improved Thermal Performance with Polyimide Based Laminate Substrates." IMAPS Advanced Technology Workshop on Packaging Assembly of Power LEDS, Sep. 13, 2006-Sep. 15, 2006, pp. 1-5.

(Continued)

*Primary Examiner* — A. Dexter Tugbang
*Assistant Examiner* — Azm Parvez

(57) ABSTRACT

This invention is directed to bendable circuit substrate structures useful for LED mounting and interconnection.

18 Claims, 2 Drawing Sheets

(56) References Cited

U.S. PATENT DOCUMENTS

| | | | |
|---|---|---|---|
| 7,201,511 | B2 | 4/2007 | Moriyama et al. |
| 7,210,818 | B2 | 5/2007 | Luk et al. |
| 7,284,882 | B2 | 10/2007 | Burkholder |
| 8,071,882 | B2 * | 12/2011 | Okajima et al. ............. 174/250 |
| 2004/0160768 | A1 | 8/2004 | Cok |
| 2005/0174769 | A1 | 8/2005 | Yong et al. |
| 2006/0024517 | A1 | 2/2006 | Doan et al. |
| 2007/0076381 | A1 | 4/2007 | Han et al. |

OTHER PUBLICATIONS

Machine Translation of JP 2005-056729, Kido et al., Mar. 2005.

Morris, T., Canadian Electronics Magazine e-magazine, "Aluminum Substrates Make Light Work of Visible LED Circuits", Sep. 18, 2007.

Stevenson, Richard, "Poor Fixtures Threaten to Jeopardize the Illumination Potential of LEDs", Compound Semiconductor, Jun. 2007.

* cited by examiner

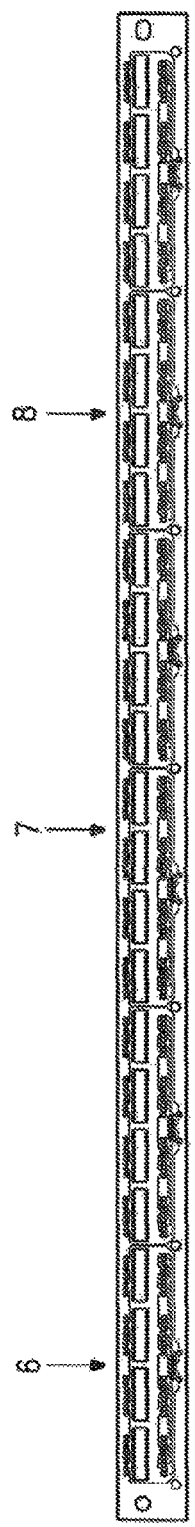
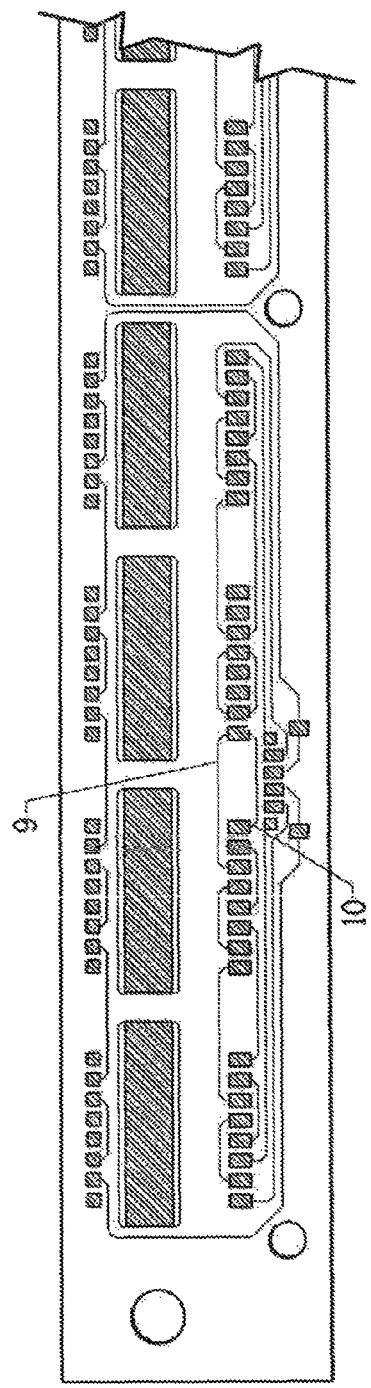
FIG. 1
FIG. 2

| | LX | LU | LC |
|---|---|---|---|
| (5) | LIQUID OR FILM SOLDER MASK | | |
| (4) | ½ TO 4 OUNCE | | |
| (3) | FILLED PI | N/A | FILLED PI |
| (2) | N/A | WA ADHES. | N/A |
| (1) | CU OR AL | CU OR AL | CU OR AL |

BENDABLE CIRCUIT BOARD FOR LED MOUNTING AND INTERCONNECTION

RELATED APPLICATIONS

This application is a continuation of U.S. patent application Ser. No. 13/269,148, filed Oct. 7, 2011, which is a continuation of U.S. patent application Ser. No. 12/744,685, filed May 26, 2010, which is a 35 U.S.C. §371 National Stage Application of International PCT/US08/85292, which claims Priority to Provisional Application 61/005,222, filed Dec. 4, 2007.

FIELD OF THE INVENTION

This invention is directed to a flexible substrate structure used for LED (light emitting diode) mounting and Interconnection.

TECHNICAL BACKGROUND OF THE INVENTION

Insulated metal substrates are being used for the mounting and interconnection of light emitting diodes (LEDs) in applications such as display back lighting, automotive lighting and general commercial and consumer lighting uses. The substrates currently being used are generally rigid and are not able to be deformed and bent without degradation or damage to their mechanical, electrical and thermal properties. It is desirable to be able to form or bend such substrate materials to make angles, curves or bends, while maintaining mechanical and thermal integrity and without causing degradation of the substrate or of its electrical properties.

Multi-functional electronic substrate materials of various kinds are known in the art. Some of the layers of these substrates can be made of various polymer materials such as polyimide (hereinafter referred to as "PI"). In general, these are rigid structures with little flexibility, unless the structure is grooved.

US 2007/0076381 A1, for example, describes a flexible heat spreader circuit board with a heat sink. The flexibility of its circuit board results from a pattern of grooves that make an upper surface and a lower surface flexible when the substrate is bent.

Aluminum substrates are known for use in visible LED Circuits. Canadian Electronics Magazine e-magazine, for example as shown in an article titled "Aluminum Substrates Make light work of visible LED Circuits" by Tom Morris, dated Sep. 18, 2007. Economical solderable polymer thick film conductors can be screen printed directly onto such substrates, without degradation. The article mentions that aluminum alloy substrates can be extruded, die cast and made in special shapes. The thermally conductive aluminum alloy material enables design engineers to mount high power LED components directly to it. However, no mention is made of any flexibility of such alloy substrates.

In an article titled "Poor fixtures threaten to jeopardize the illumination potential of LEDs" by Richard Stevenson, Compound Semiconductor, June 2007, the author points out that the low efficiency of many fixtures in the industry results from lack of skills relating to working on the design aspects of these fixtures, by the workforce of many companies, who work with the electrical systems used in powering LEDs. These techniques are needed for thermal management and optical design.

As applications expand requiring more complex mechanical configurations and circuitry becomes thinner and more complicated, it is desirable for the substrates to be shapeable without any resulting degradation of the substrate surface characteristics or without interfering with their thermal or electrical properties. It is also desirable for chosen substrates to be cost effective, be easy to handle and be able to be used in fixtures allowing the best use of the light from an LED. The laminate described in the present patent application is useful in such fixtures as it can be shaped for improved optical properties without any degradation of its electrical properties and with its thermal properties maintained. The ability to bend a laminated structure without degrading the electrical circuitry allows the configuring of LED's in a "3D" format. Such structures are not limited to a planar format. Having this bendable ability provides the device designer with more options to tailor and optimize the device design. Overcoming the limitations in LED mounting and LED structure and fixtures imposed by rigid substrate materials and interconnection materials allows the designer to customize and optimize the mechanical features found in Solid State lighting components.

The present flexible structure is expected to increase overall optical electrical efficiency from 30% to 40% of the range currently seen in LED structures and to optimize the configuration manually by allowing the bending at the most efficient configuration to concentrate and disperse LED light.

SUMMARY OF THE INVENTION

The present invention concerns a laminate comprising, on a substrate the following layers:
 (a) a copper or aluminum metal layer;
 (b) a polyimide or adhesive layer, the metal layer being adjacent to the polyimide or adhesive layer
 (c) copper foil layer and
 (d) liquid or film solder mask layer.

The laminate may be a thin polymer based copper clad filled polyimide (PI), for example a CooLam™ thermal laminate such as LC (Alumina Filled PI) and LX (Alumina Filled PI), used in conjunction with an aluminum alloy composition substrate. The laminate may also be an anodized aluminum CooLam™ thermal laminate, such as LU (Anodized Aluminum and with adhesive). Such laminates must be designed to be used in a composition of the proper thickness for LED applications. Use of such laminates creates a versatile and bendable structure for ease of use in LED packaging.

As pointed out above, a suitable family of materials useful in this invention is the CooLam™ thermal laminates. Examples are embodiments such as LC (Alumina Filled PI), LU (Anodized Aluminum with adhesive) and LX (Alumina Filled PI). A CooLam™ structure consists of a metal, optionally an adhesive (only in the LU (Anodized Aluminum with adhesive) embodiment), polyimide (PI), copper foil and a solder mask. See drawings FIGS. 3A and 3B (key). LU products may also be alumina filled.

BRIEF DESCRIPTION OF THE DRAWING

FIG. 1 shows a typical laminate substrate, with bend locations 6, 7 and 8.

FIG. 2 shows the detail of test lines 6. Two traces that were measured are labeled 9 and 10.

In FIG. 3(B) the ½ ounce to 4 ounces Cu, in metric units, is "14.79 milliliters to 118.29 milliliters".

DETAILED DESCRIPTION OF THE INVENTION

Figures 3A, 3B:
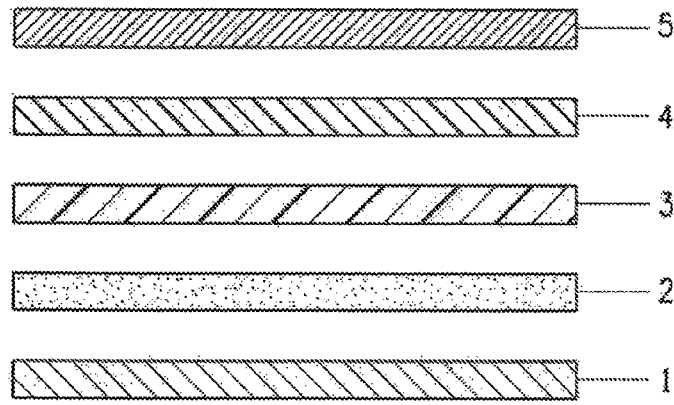
FIG. 3(A) shows the stacking arrangements of CooLam™ Laminates.
FIG. 3(B) serves as a "key" to the drawing in FIG. 3(A).

Referring to FIGS. 3(A) and 3(B), the term "laminate" herein is referred to as the metal (1) and the polyimide (3), and adhesive (2) where adhesive is present, plus the copper foil (4). The term "substrate" refers to the metal itself (1). The finished product with patterned copper foil and solder mask (5) is called a "Metal Core Printed Circuit Board" or an "Insulated Metal Substrate" (IMS).

In one embodiment, the copper is at 18 um, the dielectric is at 6 um and aluminum is at 100 um. In another embodiment the copper is at 35 um, dielectric is at 12 um and the aluminum is at a thickness selected from the following group of thicknesses: 200 um and 247 um.

The composite films of the present invention are generally derived from a multi-layer structure having one or more polyimide composite layers. These polyimide composites and layers can have thermal conductivity, electrical conductivity, electrical resistivity, electrical capacitance and other desirable properties. They can also be layered in various ways to create other sought after properties. An example of such a layering plan for a coating on a substrate is described in U.S. Pat. No. 7,100,814, which is incorporated herein by reference. Some of the layered structures known in the art lack flexibility which results in cracking and breakage upon their use. The laminate thickness is from about 125 microns to about 3 millimeters. Allowing substrate flexibility results in cost reduction, the need for fewer pieces, need for less handling and greater ease of installation, along with improved appearance and the ability to create custom shapes and more efficient configurations to concentrate or distribute light, offering improved illumination and appearance characteristics.

EXAMPLES

Tests to Determinate Interconnection Integrity of the Present Laminate

Tests to determine interconnection integrity of CooLam™ laminate under bending stress were performed on substrates fabricated with 17 micron thick CooLam™ thermal laminate and 2 mm thick Aluminum Alloy 5005 using a LCD Backlight Unit circuit design. The purpose of this testing was to determine the feasibility of offering this type of construction for applications in LED lighting.

The overall sample size was 17 mm×423 mm (⅝"×17") and consists of 6 identical segments is shown in FIG. 1.

Three locations on each of six pieces were tested as shown in FIG. 1. The resistance of two 11.8 mil 1.4 mil thick traces, shown as 9 and 10 in FIG. 2, in each location was measured before and after bending. The bend point centerline on each segment was positioned on the centerline of a 1⅛" diameter mandrel and bent by hand to an approximate 90 degree bend. The laminate/conductor was on the outside of the bend putting the material in tension. The actual bend profile for each location tested was traced or compared to prior sample traces and entered in a notebook with the test data. The following Table 1 tabulates the resistance test results for the configurations. Visual examination at the bend point evidenced no cracking or crazing of the solder mask. Resistance measurements were performed using an Electro Scientific Industries 1700 series Micro-Ohmmeter system using the 20 milliohm range (resolution of 1 micro Ohm).

The average change in resistance of all the circuit lines was 1.55 milliohms with a maximum of 3 milliohms and a minimum of 0.8 milliohms. This testing indicates that the CooLam™ material used in a metal-backed structure has the potential to be bent to 90 degrees or greater angles with reliable interconnections.

TABLE 1

| SAMPLE | LOCATION | TRACE | RESISTANCE BEFORE BENDING-MILLIOHMS | RESISTANCE AFTER BENDING-MILLIOHMS | RESISTANCE CHANGE-MILLIOHMS |
|---|---|---|---|---|---|
| 1 | 1 | 1 | 17.3 | 18.2 | 0.9 |
| 1 | 1 | 2 | 17 | 17.9 | 0.9 |
| 1 | 2 | 1 | 17 | 18.5 | 1.5 |
| 1 | 2 | 2 | 17.6 | 18.4 | 0.8 |
| 1 | 3 | 1 | 17.4 | 18.5 | 1.1 |
| 1 | 3 | 2 | 17.8 | 18.6 | 0.8 |
| 2 | 1 | 1 | 17.3 | 19.3 | 2 |
| 2 | 1 | 2 | 17.2 | 19 | 1.8 |
| 2 | 2 | 1 | 17.7 | 19.4 | 1.7 |
| 2 | 2 | 2 | 18.1 | 19.2 | 1.1 |
| 2 | 3 | 1 | 17.8 | 18.6 | 0.8 |
| 2 | 3 | 2 | 17.6 | 19.7 | 2.1 |
| 3 | 1 | 1 | 17.8 | 19.6 | 1.8 |
| 3 | 1 | 2 | 16.5 | 19.5 | 3 |
| 3 | 2 | 1 | 17.9 | 19.6 | 1.7 |
| 3 | 2 | 2 | 17.6 | 19.3 | 1.7 |
| 3 | 3 | 1 | 18.2 | 19.3 | 1.1 |
| 3 | 3 | 2 | 17.8 | 19.4 | 1.6 |
| 4 | 1 | 1 | 18.5 | 19.5 | 1 |
| 4 | 1 | 2 | 18 | 19.9 | 1.9 |
| 4 | 2 | 1 | 18.2 | 19.8 | 1.6 |
| 4 | 2 | 2 | 17.9 | 19.7 | 1.8 |
| 4 | 3 | 1 | 17.9 | 19.7 | 1.8 |
| 4 | 3 | 2 | 18 | 19.6 | 1.6 |
| 5 | 1 | 1 | 17.3 | 19.2 | 1.9 |
| 5 | 1 | 2 | 17.9 | 19.8 | 1.9 |
| 5 | 2 | 1 | 17.6 | 19.3 | 1.7 |
| 5 | 2 | 2 | 18 | 19.2 | 1.2 |
| 5 | 3 | 1 | 17.7 | 19.8 | 2.1 |
| 5 | 3 | 2 | 17.9 | 19.4 | 1.5 |

TABLE 1-continued

| SAMPLE | LOCATION | TRACE | RESISTANCE BEFORE BENDING- MILLIOHMS | RESISTANCE AFTER BENDING- MILLIOHMS | RESISTANCE CHANGE- MILLIOHMS |
|---|---|---|---|---|---|
| 6 | 1 | 1 | 17.9 | 19.2 | 1.3 |
| 6 | 1 | 2 | 17.9 | 19.8 | 1.9 |
| 6 | 2 | 1 | 18.3 | 19.6 | 1.3 |
| 6 | 2 | 2 | 18.1 | 19.7 | 1.6 |
| 6 | 3 | 1 | 17.9 | 19.5 | 1.6 |
| 6 | 3 | 2 | 18.3 | 19.9 | 1.6 |

What is claimed is:

1. A method of manufacturing a laminated structure for mounting light emitting diodes ("LED") to a 90° or greater configured angle, comprising:
   A. providing a bendable laminate circuit structure, the bendable laminate circuit structure having at least the following laminated layers:
      a. a continuous aluminum metal layer of about 0.2 mm to about 2 mm in thickness;
      b. a polyimide composite layer having a first surface directly contacting the first surface of the aluminum metal layer; and
      c. a copper foil layer directly contacting a second surface of the polyimide composite layer; and
   B. bending the laminated layers 90° or more, such that after bending the laminated layers of the bendable circuit structure for mounting LED mounting has an increase in electrical resistance of less than 10%.

2. The method of claim 1 wherein the providing step includes providing a laminate wherein the copper layer is about 35 um thick, the polyimide layer is about 12 um thick and the aluminum layer is about 200 um to 247 um thick.

3. The method of claim 1 wherein the providing step includes providing a continuous aluminum metal layer that is about 0.4 mm to about 2 mm in thickness.

4. The method of claim 1, wherein the bendable laminate structure has a thickness to about 3 millimeters.

5. The method of claim 1, where the copper foil layer is a circuitized layer.

6. The method of claim 1, wherein the providing step includes providing the polyimide composite layer which is about 12 um thick.

7. The method of claim 1, wherein the providing step includes providing a copper foil layer that consists essentially of copper foil layer, and an optional solder mask layer.

8. The method of claim 1, wherein the providing step includes providing a continuous aluminum layer that is anodized.

9. The method of claim 1, wherein the continuous aluminum layer is Alloy 5005.

10. A method of manufacturing a laminated structure for mounting light emitting diodes ("LED") to a 90° or greater configured angle, comprising:
   A. providing a bendable, laminated circuit structure, the bendable, laminated circuit structure having:
      a. a continuous aluminum metal layer of about 0.2 mm to about 2 mm in thickness;
      b. a polyimide composite layer having a first surface directly contacting the first surface of the aluminum metal layer; and
      c. a copper layer directly contacting a second surface of the polyimide composite layer, the copper layer consists essentially of a copper foil layer with a solder mask layer; and
   bending the laminated circuit structure 90° or more, such that after bending the laminated circuit structure, the structure for LED mounting has an increase in electrical resistance of less than 10%.

11. The method of claim 10, wherein the copper layer is a circuitized layer.

12. The method of claim 10, wherein the providing step includes providing the polyimide composite layer that is about 12 um thick.

13. A method of manufacturing a laminated structure for mounting light emitting diodes ("LED") to a 90° or greater configured angle, comprising:
   A. providing a bendable laminated circuit structure, the bendable laminated circuit structure having at least the following laminated layers:
      a. a continuous aluminum metal layer of about 0.2 mm to about 2 mm in thickness;
      b. a polyimide composite layer having a first surface directly contacting the first surface of the aluminum metal layer; and
      c. a copper layer directly contacting a second surface of the polyimide composite layer, the copper layer consists of a copper foil layer and a solder mask layer; and
   B. bending the laminated circuit structure 90° or more, such that after bending the laminated layers the bendable circuit structure for mounting LED mounting has an increase electrical resistance of less than 10%.

14. The method of claim 10, wherein the continuous aluminum metal layer is about 0.4 mm to about 2 mm in thickness.

15. The method of claim 13, wherein the continuous aluminum metal layer is about 0.4 mm to about 2 mm in thickness.

16. The method of claim 10, wherein the bendable laminate structure has a thickness to about 3 millimeters.

17. The method of claim 13, wherein the bendable laminated structure has a thickness to about 3 millimeters.

18. The method of claim 10 wherein the providing step includes providing a polyimide composite layer that is about 12 um thick.

* * * * *